United States Patent
Lai et al.

(10) Patent No.: US 11,069,704 B2
(45) Date of Patent: Jul. 20, 2021

(54) 3D NOR MEMORY HAVING VERTICAL GATE STRUCTURES

(71) Applicant: MACRONIX INTERNATIONAL CO., LTD., Hsinchu (TW)

(72) Inventors: Erh-Kun Lai, Longling Shiang (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 78 days.

(21) Appl. No.: 16/378,969

(22) Filed: Apr. 9, 2019

(65) Prior Publication Data

US 2020/0328224 A1    Oct. 15, 2020

(51) Int. Cl.
| | |
|---|---|
| *H01L 27/11582* | (2017.01) |
| *H01L 21/28* | (2006.01) |
| *H01L 27/1157* | (2017.01) |
| *G11C 7/12* | (2006.01) |
| *H01L 27/11* | (2006.01) |
| *H01L 27/11565* | (2017.01) |

(52) U.S. Cl.
CPC ......... *H01L 27/11582* (2013.01); *G11C 7/12* (2013.01); *H01L 27/11* (2013.01); *H01L 27/1157* (2013.01); *H01L 27/11565* (2013.01); *H01L 29/40117* (2019.08)

(58) Field of Classification Search
CPC .......... H01L 27/11582; H01L 27/1157; H01L 29/40117
See application file for complete search history.

(56) References Cited

U.S. PATENT DOCUMENTS

| | | | |
|---|---|---|---|
| 8,630,114 B2 * | 1/2014 | Lue | ............ H01L 27/0688 365/185.05 |
| 10,211,218 B2 * | 2/2019 | Lue | ............ H01L 23/528 |
| 10,777,566 B2 | 9/2020 | Lue | |

(Continued)

FOREIGN PATENT DOCUMENTS

TW    I493545 B    7/2015

OTHER PUBLICATIONS

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

(Continued)

*Primary Examiner* — Khaja Ahmad
*Assistant Examiner* — Khatib A Rahman
(74) *Attorney, Agent, or Firm* — Haynes Beffel & Wolfeld LLP

(57) ABSTRACT

A memory device comprises a plurality of stacks of bit lines alternating with insulating strips over an insulating layer on a substrate, and a plurality of vertical gate structures disposed between the stacks. Vertical channel structures and memory elements are disposed between outside surfaces of the vertical gate structures and sidewalls of insulating strips in the stacks of bit lines. The vertical channel structures provide channels between adjacent bit lines in the stacks. A plurality of word line transistors is disposed over and connected to respective vertical gate structures. A plurality of word lines is disposed over and connected to the word line transistors. The memory device comprises circuitry connected to the bit lines to apply bit line and source line voltages to the bit lines.

17 Claims, 15 Drawing Sheets

(56) References Cited

U.S. PATENT DOCUMENTS

| | | | | |
|---|---|---|---|---|
| 10,790,023 | B2* | 9/2020 | Harari | G11C 16/10 |
| 10,910,393 | B2 | 2/2021 | Lai et al. | |
| 2005/0280061 | A1* | 12/2005 | Lee | H01L 24/83 |
| | | | | 257/296 |
| 2011/0018051 | A1* | 1/2011 | Kim | H01L 29/7926 |
| | | | | 257/324 |
| 2011/0140070 | A1* | 6/2011 | Kim | G11C 11/5678 |
| | | | | 257/5 |
| 2013/0119455 | A1* | 5/2013 | Chen | H01L 27/11578 |
| | | | | 257/324 |
| 2017/0287928 | A1* | 10/2017 | Kanamori | H01L 27/11582 |
| 2019/0148393 | A1 | 5/2019 | Lue | |
| 2020/0343252 | A1 | 10/2020 | Lai et al. | |

OTHER PUBLICATIONS

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Office Action in application 10920426760 dated May 6, 2020, 8 pages.

* cited by examiner

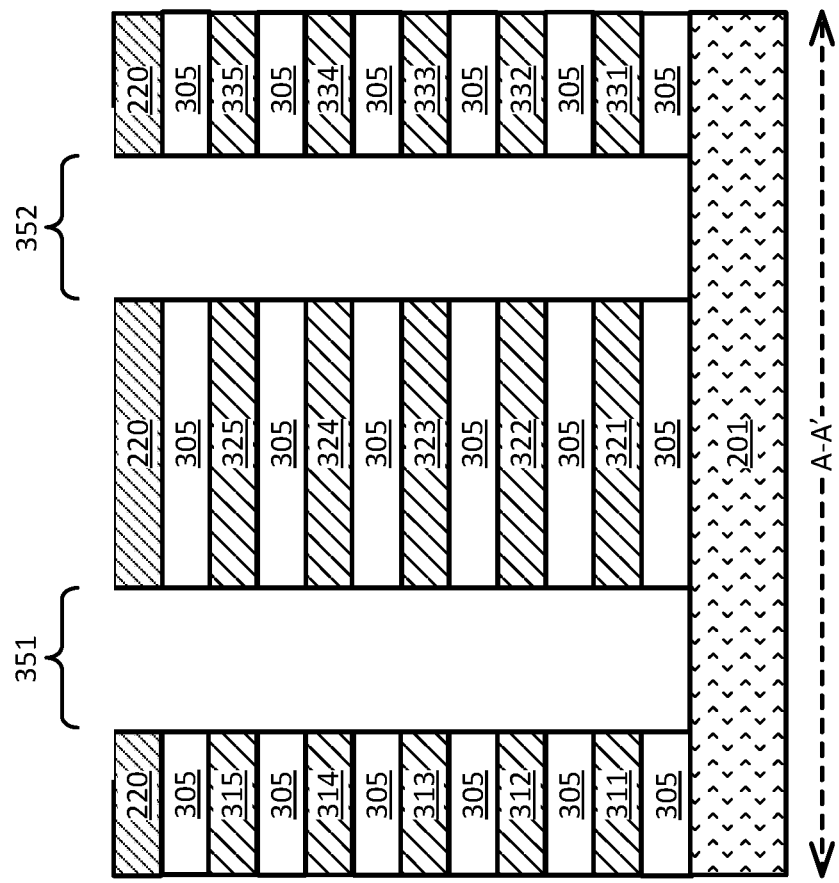
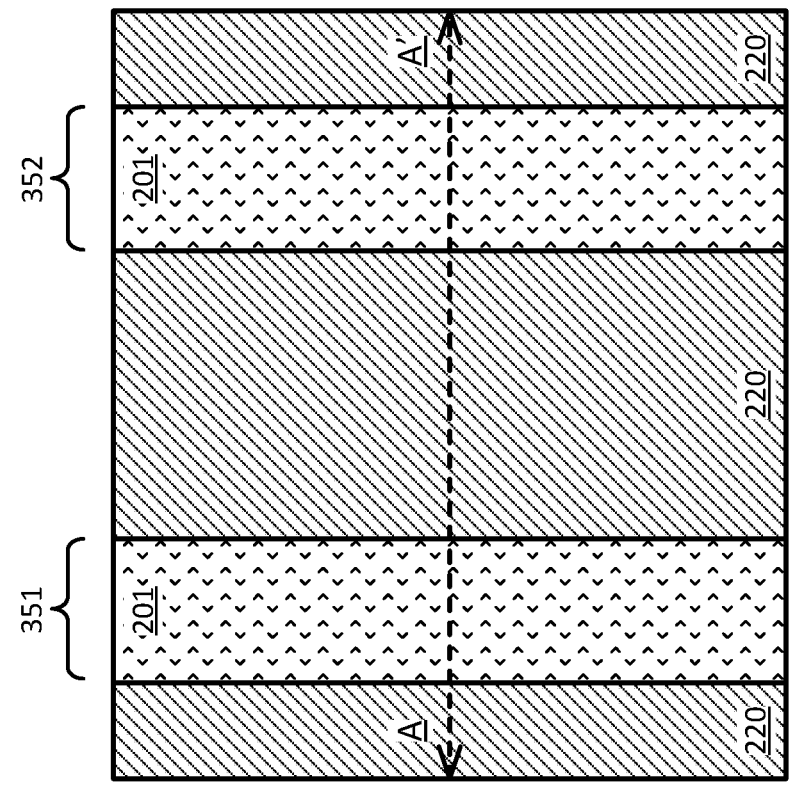
Fig. 3A
Fig. 3B

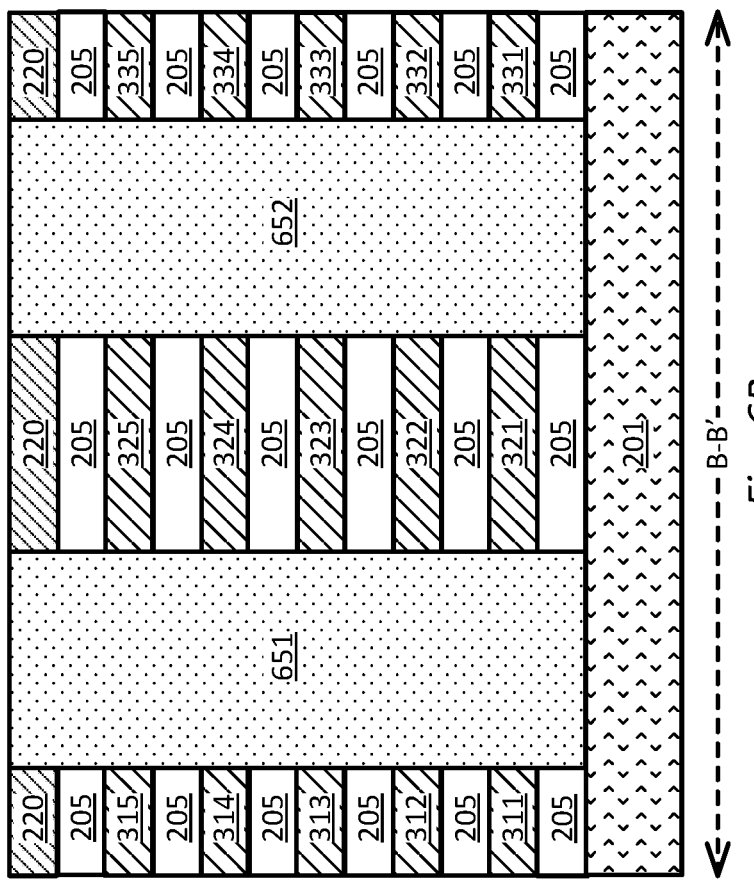
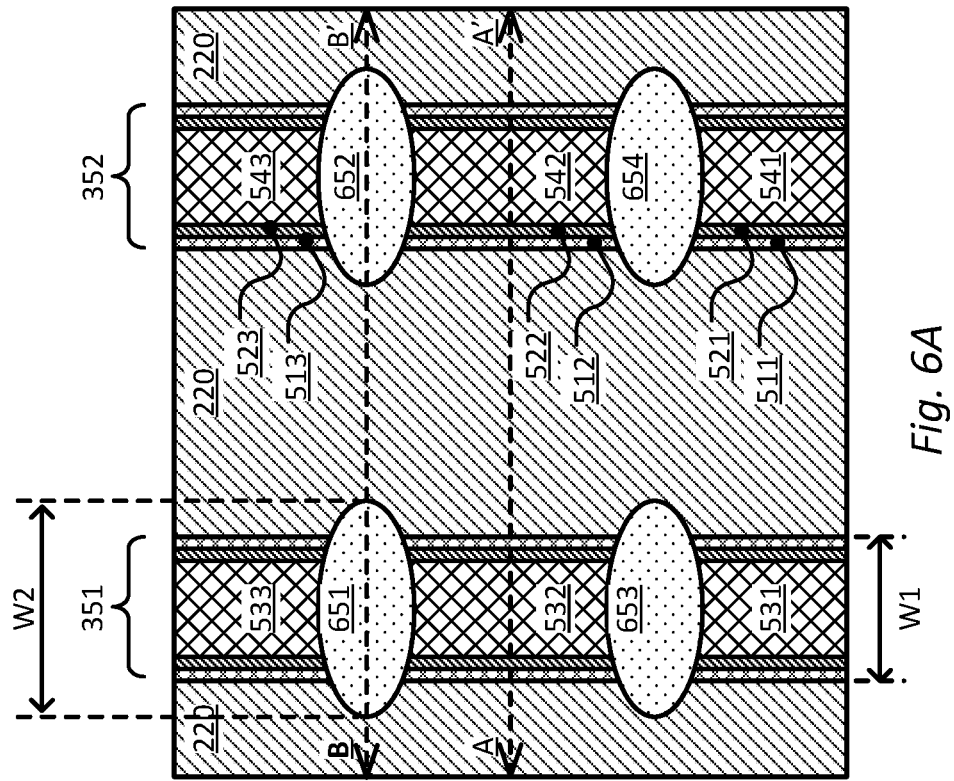
Fig. 6A
Fig. 6B

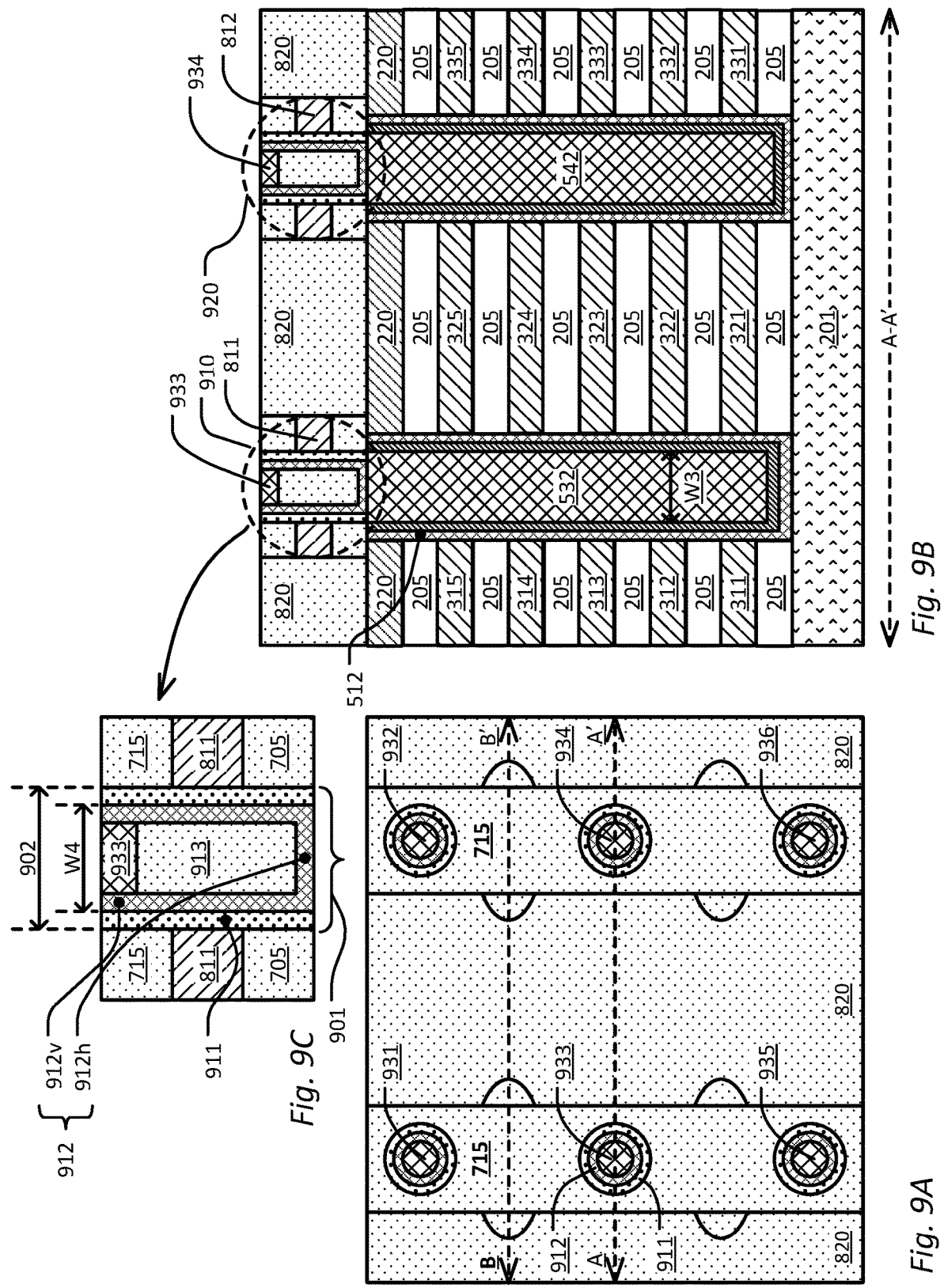

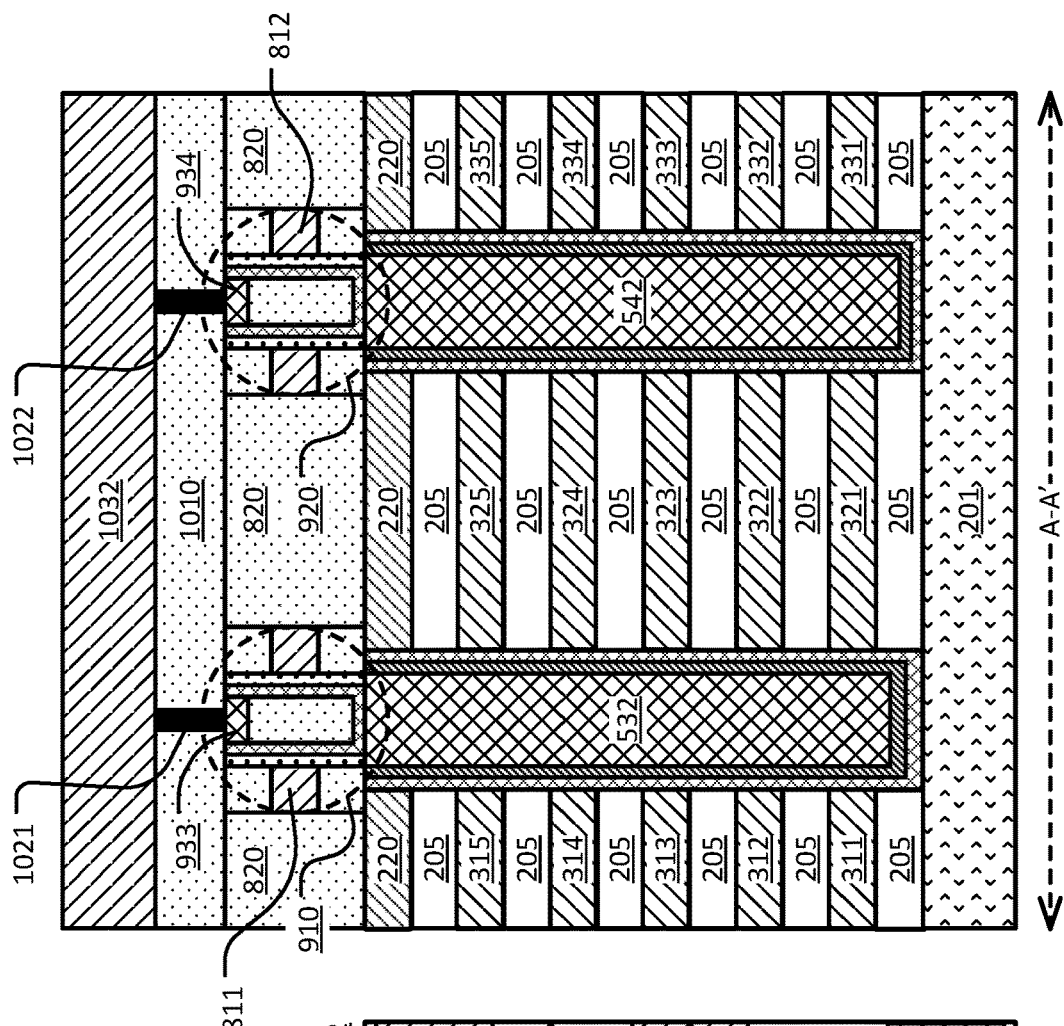
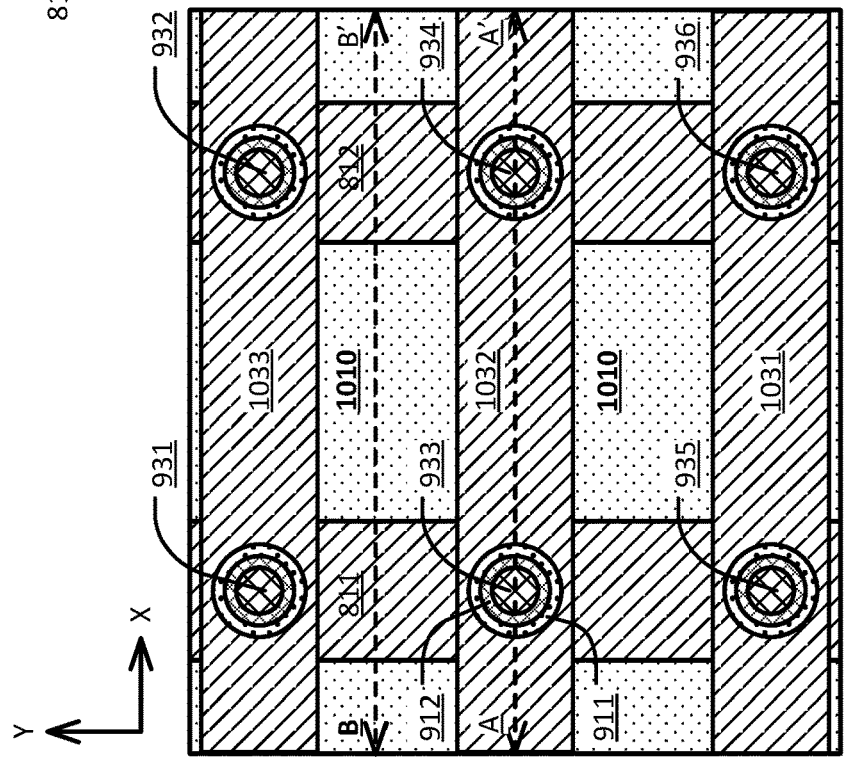
Fig. 10B
Fig. 10A

3D NOR MEMORY HAVING VERTICAL GATE STRUCTURES

BACKGROUND

Field

The present technology relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

A planar NOR flash memory is a random access memory for high speed application but is limited in density. A three dimensionally stacked NAND flash memory has higher density than a planar NOR flash memory but is not a random access memory and has relatively lower operating speed.

It is desirable to provide technology for a three-dimensionally stacked integrated circuit memory having higher density, random access, and higher operating speed.

SUMMARY

A random access 3D NOR memory device having vertical gate structures is provided. The memory device comprises a plurality of stacks of bit lines alternating with insulating strips over an insulating layer on a substrate, and a plurality of vertical gate structures disposed between the stacks. Vertical channel structures and memory elements are disposed between outside surfaces of the vertical gate structures and sidewalls of insulating strips in the stacks of bit lines. The vertical channel structures can provide channels between adjacent bit lines in the stacks.

The stacks of bit lines are separated by trenches having a first width. Insulating structures can separate the vertical gate structures, the vertical channel structures, and the memory elements in the trenches. The insulating structures have a second width greater than the first width.

In an illustrated example, a plurality of word line transistors is disposed over and connected to respective vertical gate structures. A plurality of word lines is disposed over and connected to the word line transistors. The word line transistors comprise word line transistor channel structures connected at lower ends to respective vertical gate structures, and connected at upper ends to respective landing pads, where the word lines are connected to the word line transistors via contacts to the landing pads. The vertical gate structures have a third width, and the word line transistor channel structures have a fourth width less than the third width.

The memory device can comprise circuitry connected to the bit lines to apply bit line and source line voltages to the bit lines. The circuitry can be configured to select a particular memory cell disposed at a cross-point between a particular vertical gate structure and the sidewall of a particular insulating strip in a particular stack, the particular insulating strip disposed between and in contact with a first bit line and a second bit line in the particular stack. To select a particular memory cell during reading, the circuitry can be configured to execute steps including:

turning on a particular word line transistor connected to the particular vertical gate structure;

applying a word line voltage to a particular word line connected to the particular word line transistor;

applying a bit line voltage to the first bit line in the particular stack; and applying a source line voltage to the second bit line in the particular stack.

The bit line voltage can be a drain side voltage (e.g. VCC) and the source line voltage can be a source side voltage (e.g. 0V). The bit lines other than the first and second bit lines in the first stack can be floated when applying the bit line voltage and the source line voltage. The order in which the steps are shown do not necessarily indicate the order in which the steps are executed. For instance, a bit line voltage and a source line voltage can be applied before or after a word line voltage is applied. For instance, the particular word line transistor can be turned on before or after the word line voltage is applied to the particular word line.

In one embodiment, the first and second bit lines can be disposed at levels below a top level of the stacks, and the bit line and source line voltages are not applied to the top level of the stacks, so the bit lines at the top level act as dummy bit lines.

A method is also provided for manufacturing a memory device as described herein.

Other aspects and advantages of the present technology can be seen on review of the drawings, the detailed description and the claims, which follow.

BRIEF DESCRIPTION OF THE DRAWINGS

FIGS. 2, 3A, 3B, 4A, 4B, 5A, 5B, 6A, 6B, 7A, 7B, 8A, 8B, 9A, 9B, 9C, 10A, 10B and 10C illustrate stages of a simplified process flow for manufacturing a memory device.

FIG. 2 illustrates a stage in the process flow after forming a stack of conductive layers alternating with insulating layers over a substrate.

FIGS. 3A and 3B illustrate a stage in the process flow after etching a stack of conductive layers.

FIGS. 4A and 4B illustrate a stage in the process flow after depositing a channel film on sidewalls of the stacks, and depositing layers of memory materials over the channel film on sidewalls of the stacks.

FIGS. 5A, 5B, 6A and 6B illustrate a stage in the process flow after forming vertical gate structures, vertical channel structures, and memory elements.

FIGS. 7A, 7B, 8A and 8B illustrate stages in the process flow for forming horizontal conductive lines over and insulated from the top surfaces of the vertical gate structures.

FIGS. 9A, 9B and 9C illustrate stages in the process flow for forming a plurality of word line transistors disposed over and connected to respective vertical gate structures.

FIGS. 10A, 10B and 10C illustrate a stage in the process flow after forming a plurality of word lines over and connected to the word line transistors.

DETAILED DESCRIPTION

Figure 1:
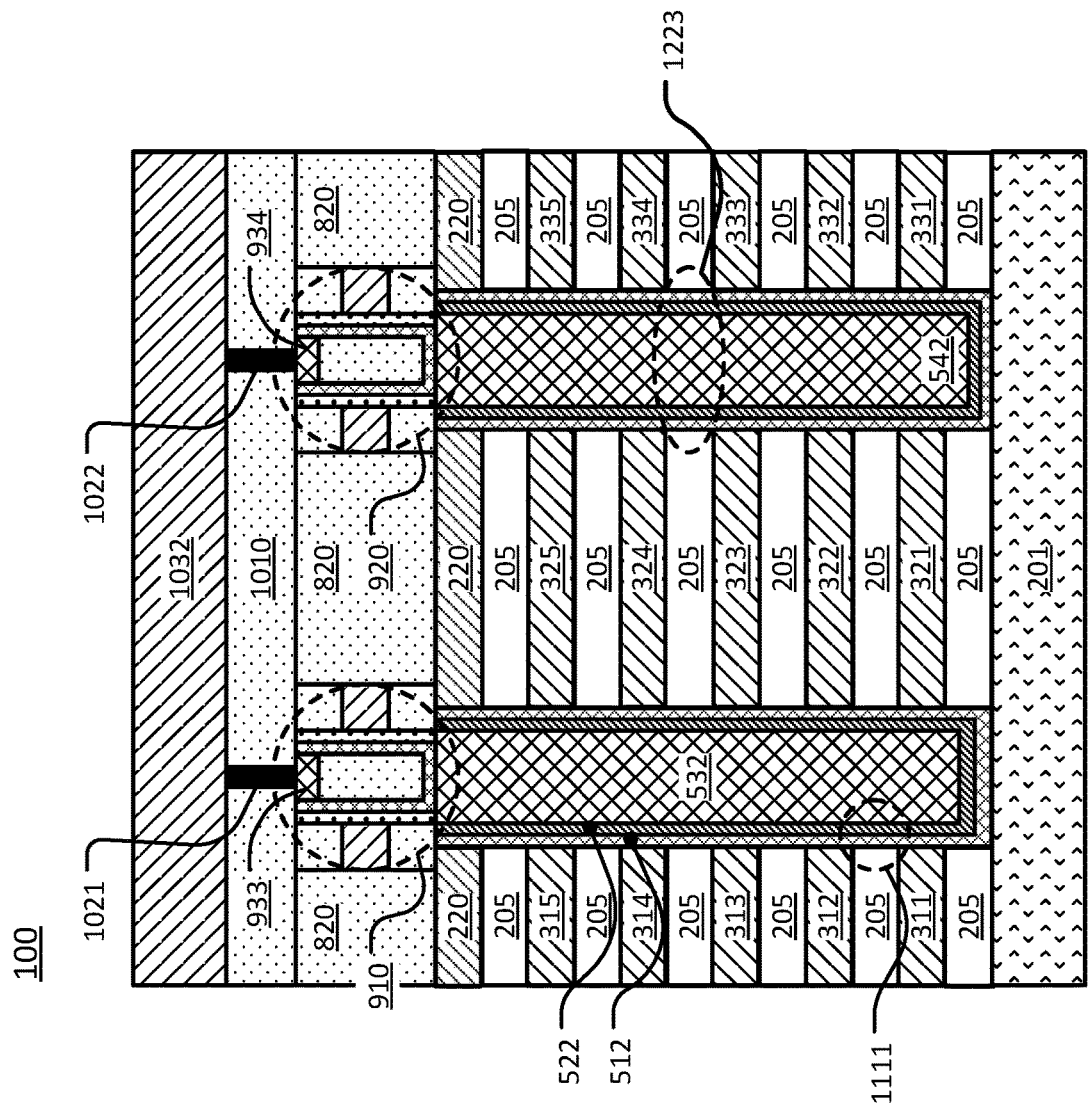
FIG. 1 is a simplified vertical cross-sectional diagram of a memory device.

A detailed description of embodiments of the present invention is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified vertical cross-sectional diagram of a memory device. As shown in the example of FIG. 1, a memory device 100 comprises a plurality of stacks of bit lines (311-315, 321-325, 331-335) alternating with insulating strips 205 over an insulating layer 201 on a substrate, a plurality of vertical gate structures (532, 542) disposed between the stacks, and vertical channel structures 512 and memory elements 522 disposed between outside surfaces of the vertical gate structures and sidewalls of insulating strips in the stacks of bit lines. The vertical channel structures (e.g. 512) can provide channels between adjacent bit lines (e.g. 311, 312) in the stacks. A hard mask 220 can be disposed on top of the stack of bit lines.

The vertical channel structures 512 can include undoped polysilicon. The memory elements 522 can include multi-layer dielectric charge trapping structures known from flash memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon), or other charge trapping layers or combinations of those layers.

The memory device comprises a plurality of word line transistors (910, 920) disposed over and connected to respective vertical gate structures, and a plurality of word lines (e.g. 1032) disposed over and connected to the word line transistors. The word line transistors comprise channel films connected at lower ends to respective vertical gate structures, and connected at upper ends to respective landing pads (933, 934), where the word lines are connected to the word line transistors via contacts (1021, 1022) to the landing pads. An insulating fill 820, such as silicon oxide and other insulating materials, separates adjacent word line transistors. The word line transistors are further described in reference to FIGS. 9A, 9B and 9C.

An insulating layer 1010 is disposed over the plurality of word line transistors (910, 920) and the landing pads (933, 934). Contacts (1021, 1022) through the insulating layer 1010 are disposed over and connected to respective landing pads. Word lines (e.g. 1032) are connected to the landing pads via the contacts (1021, 1022).

In one embodiment, the first and second bit lines can be disposed at levels below a top level of the stacks, and the bit line and source line voltages are not applied to the top level of the stacks, so the bit lines at the top level act as dummy bit lines.

As an example, a particular memory cell (e.g. 1111) can be disposed at a cross-point between a particular vertical gate structure (e.g. 532) and the sidewall of a particular insulating strip (e.g. 205) in a particular stack (e.g. 311-315). The particular insulating strip is disposed between and in contact with a first bit line 311 and a second bit line 312 in the particular stack.

Although not shown in FIG. 1, the memory device comprises circuitry (1452, FIG. 14) connected to the bit lines in the stacks to apply bit line and source line voltages to the bit lines. For a single channel operation, the circuitry can be configured to select a particular memory cell (e.g. 1111).

To select a particular memory cell in a single channel operation during reading, the circuitry can be configured to execute steps including:

turning on a particular word line transistor (910) connected to the particular vertical gate structure (532);

applying a word line voltage to a particular word line (1032) connected to the particular word line transistor;

applying a bit line voltage to the first bit line (312) in the particular stack; and applying a source line voltage to the second bit line (311) in the particular stack.

A bit line voltage can be a drain side voltage (e.g. VCC) and a source line voltage (e.g. 0V) can be a source side voltage. Bit lines in the particular stack other than the first and second bit lines connected to the selected particular memory cell can be floated when applying the bit line voltage and the source line voltage. The order in which the steps are shown above do not necessarily indicate the order in which the steps are executed. For instance, a bit line voltage and a source line voltage can be applied after a word line voltage is applied.

For a double channel operation, the circuitry can be configured to select a particular memory cell (e.g. 1223) disposed at a first cross-point between a particular vertical gate structure (542) and the sidewall of a first insulating strip in a first stack (321-325) and at a second cross-point between the particular vertical gate structure (542) and the sidewall of a second insulating strip in a second stack (331-335) adjacent the first stack, where the first insulating strip 205 is disposed between and in contact with a first bit line 324 and a second bit line 323 in the first stack, and the second insulating strip 205 is disposed between and in contact with a third bit line 334 and a fourth bit line 333 in the second stack. The first and third bit lines (324, 334) are disposed at a first level in the stack, and the second and fourth bit lines (323, 333) are disposed at a second level in the stack adjacent the first level.

To select a particular memory cell in a double channel operation during reading, the circuitry can be configured to execute steps including:

turning on a particular word line transistor (932) connected to the particular vertical gate structure (542);

applying a word line voltage to a particular word line (1032) connected to the particular word line transistor;

applying bit line voltages to the first bit line (324) in the first stack and to the third bit line (334) in the second stack; and applying source line voltages to the second bit line (323) in the first stack and to the fourth bit line (333) in the second stack.

A bit line voltage can be a drain side voltage (e.g. VCC) and a source line voltage can be a source side voltage (e.g. 0V or ground). The bit lines other than the first and second bit lines in the first stack and the bit lines other than the third and fourth bit lines in the second stack can be floated when applying the bit line voltage and the source line voltage. The order in which the steps are shown above do not necessarily indicate the order in which the steps are executed. For instance, a bit line voltage and a source line voltage can be applied after a word line voltage is applied.

FIGS. 2, 3A, 3B, 4A, 4B, 5A, 5B, 6A, 6B, 7A, 7B, 8A, 8B, 9A, 9B, 9C, 10A, 10B and 10C illustrate stages of a simplified process flow for manufacturing a memory device.

Figure 2:
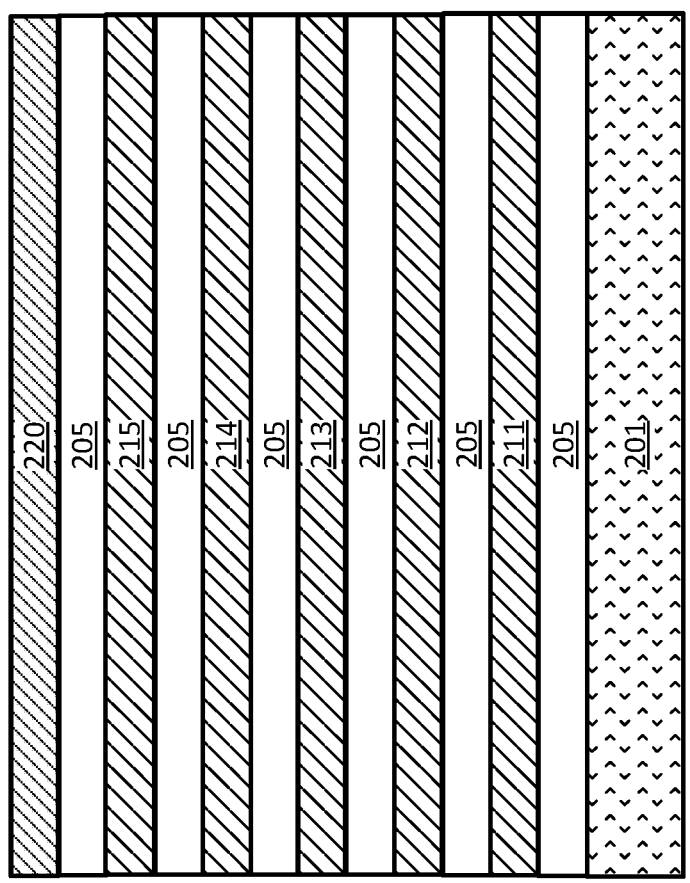

FIG. 2 illustrates a stage in the process flow after forming a stack of conductive layers 211-215 alternating with insulating layers 205 over an insulating layer 201 on a substrate. In one embodiment, the conductive layers can include N+ polysilicon for buried drain regions of memory cells in the memory device architecture. In an alternative embodiment the conductive layers can include P+ polysilicon. N+ polysilicon can have lower bit line resistance than P+ polysilicon. A hard mask 220 can be formed on top of the stack of conductive layers.

FIGS. 3A and 3B illustrate a stage in the process flow after patterning the hard mask and then etching a stack of conductive layers 211-215 (FIG. 2) using the patterned hard mask, stopping on the insulating layer 201, to form a plurality of stacks of bit lines (311-315, 321-325, 331-335) alternating with insulating strips 305. The stacks of bit lines are separated by trenches (351, 352) through the conductive layers to the insulating layer 201. Bit lines in the stacks of bit lines are analogous to buried drain lines in a planar NOR structure.

FIG. 3A is a top view of an example structure at this process stage, illustrating the hard mask 220 and trenches (351, 352) through the stack of conductive layers to expose the insulating layer 201. FIG. 3B is a vertical cross-section view of the example structure taken along a line A-A' as shown in FIG. 3A, illustrating stacks of bit lines (311-315, 321-325, 331-335) alternating with insulating strips 305, and trenches (351, 352) through to the insulating layer 201.

Figure 4B:
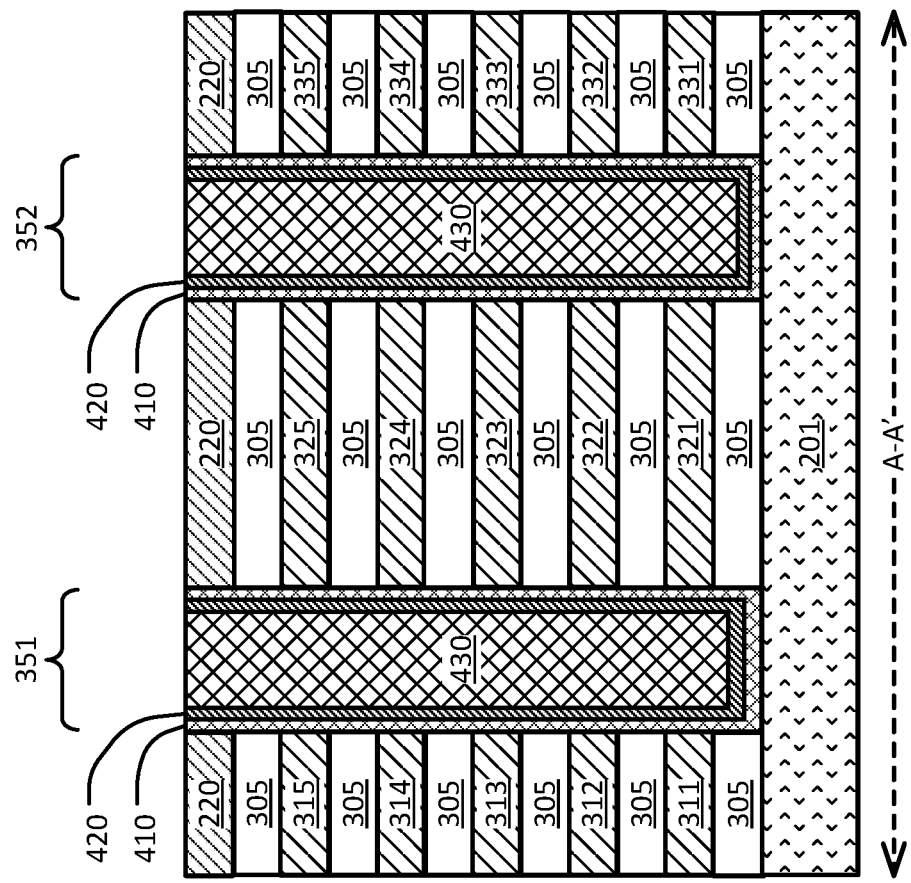
Figure 4A:
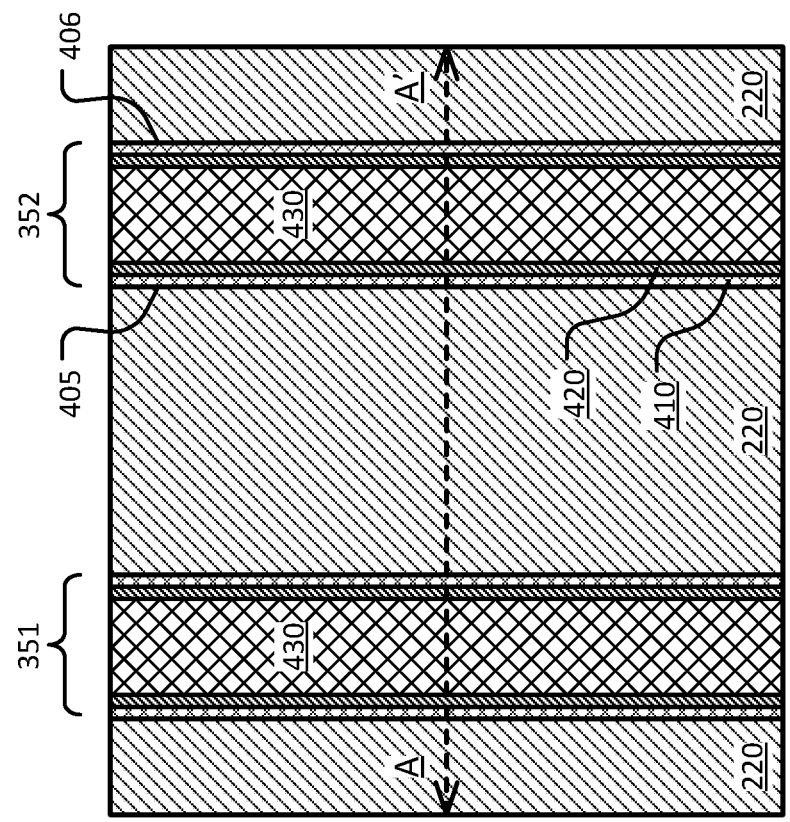

FIGS. 4A and 4B illustrate a stage in the process flow after depositing a channel film 410 on sidewalls (405, 406) of the stacks, and depositing layers of memory materials 420 over the channel film on sidewalls of the stacks. The trenches (351, 352) can be filled with conductive material 430 over the layers of memory materials 420. A chemical mechanical planarization CMP process can then be applied over the structure, stopping at the hard mask 220 on top of the stacks of bit lines.

FIG. 4A is a top view of the example structure at this process stage, illustrating a channel film 410 on sidewalls (405, 406) of the stacks, and layers of memory materials 420 over the channel film on sidewalls of the stacks. FIG. 4B is a vertical cross-section view of the example structure taken along a line A-A' as shown in FIG. 4A, illustrating a channel film 410 on sidewalls of the stacks, and layers of memory materials 420 over the channel film on sidewalls of the stacks, and conductive material 430 filling the trenches (351, 352).

Adjacent stacks of bit lines (311-315, 321-325, 331-335) can be physically or electrically separated from each other, so the adjacent stacks of bit lines can be operated independently. For instance, a first stack of bit lines 311-315 is physically separated from a second stack of bit lines 321-325, which is physically separated from a third stack of bit lines 331-335. Sidewalls of adjacent stacks of bit lines are physically separated from each other. For instance, sidewall 405 on a second stack of bit lines 321-325 are physically separated from sidewall 406 on an adjacent third stack of bit lines 331-335.

A channel film 410 on sidewalls of the stacks can include undoped polysilicon. Layers of memory materials 420 can include multilayer dielectric charge trapping structures known from flash memory technologies as ONO (oxide-nitride-oxide), ONONO (oxide-nitride-oxide-nitride-oxide), ONONONO (oxide-nitride-oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon), or other charge trapping layers or combinations of those layers.

In one embodiment, the conductive material 430 filling the trenches can include N+ or P+ polysilicon. N+ polysilicon can result in lower electrical resistance than P+ polysilicon, while P+ polysilicon can result in lower erased threshold voltage Vt, due to reduced electron injection from the conductive material 430 which can act as gates. Other embodiments can include metals, metal nitrides, other metal compounds or combinations of metals and metal compounds, such as platinum, tantalum nitride, metal silicides, aluminum or other metal or metal compound gate materials (e.g. from Ti, TiN, Ta, Ru, Ir, $RuO_2$, $IrO_2$, W, WN), and others. For some applications, it is preferable to use materials having work functions higher than 4 eV, preferably higher than 4.5 eV.

FIGS. 5A, 5B, 6A and 6B illustrate a stage in the process flow after forming vertical gate structures (531, 532 and 533), vertical channel structures (511, 512 and 513), and memory elements (521, 522 and 523).

Figure 5B:
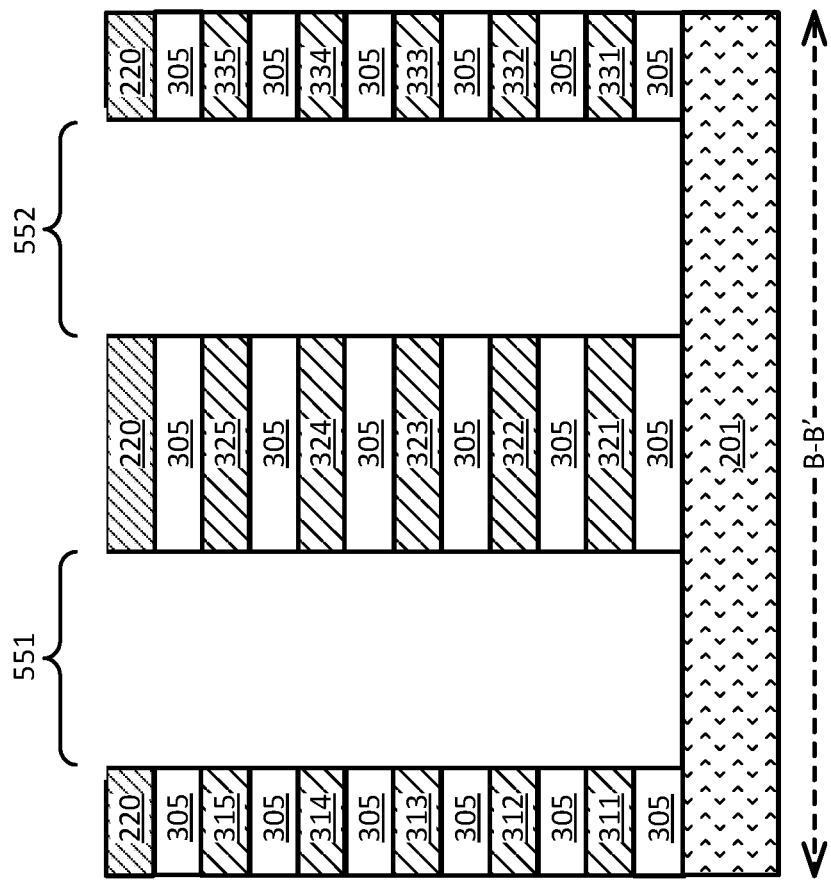
Figure 5A:
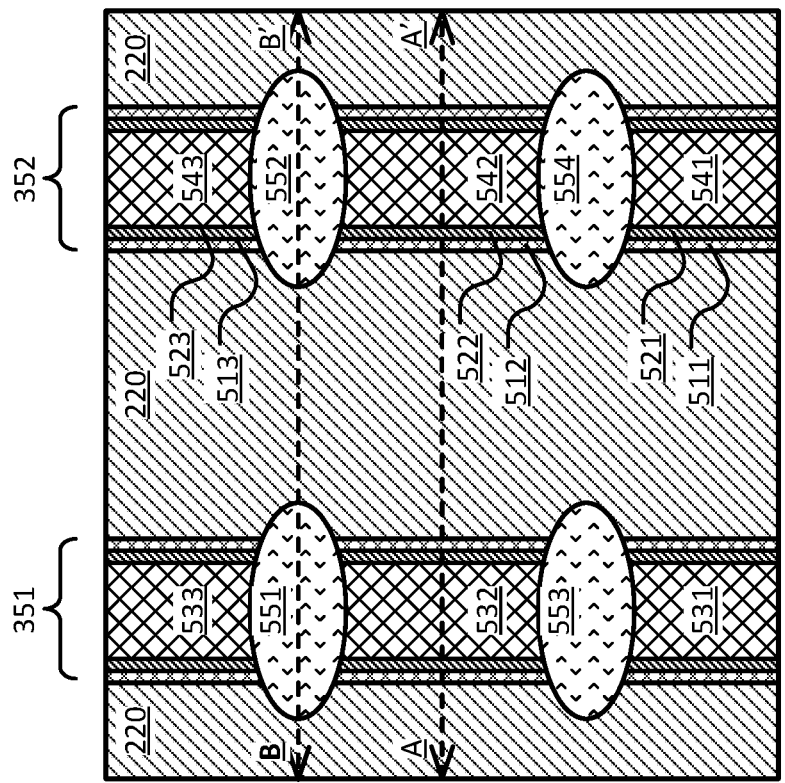

FIGS. 5A and 5B illustrate a stage in the process flow after etching holes 551-554 between the stacks of bit lines to separate the conductive material 430 in the trenches 351-352, the channel film 410, and the layers of memory materials 420 on the sidewalls of the stacks, into the vertical gate structures (531, 532 and 533), the vertical channel structures (511, 512 and 513), and the memory elements (521, 522 and 523), respectively. The layout of the etching holes can be honeycomb layout. For instance, holes 552 and 554 separate the conductive material 430 (FIG. 4A) in the trench 352 into the vertical gate structures 541, 542 and 543, separate the channel film 410 (FIG. 4) in the trench 352 into the vertical channel structures 511, 512 and 513, and separate the layers of memory materials 420 (FIG. 4) in the trench 352 into the memory elements 521, 522 and 523. Similarly, holes 551 and 553 separate the conductive material 430 (FIG. 4A) in the trench 351 into vertical gate structures 531, 532 and 533. FIG. 5A is a top view of the structure at this stage. FIG. 5B is a vertical cross sectional view of the structure taken at a line B-B' as shown in FIG. 5A. This etch step can stop on the insulating layer 201, as shown in FIG. 5B.

FIGS. 6A and 6B illustrate a stage in the process flow after filling the holes 551-554 (FIG. 5) between the stacks of bit lines with insulating material, e.g. $SiO_2$, to form insulating structures 651-654, respectively. FIG. 6A is a top view of the structure at this stage. FIG. 6B is a vertical cross sectional view of the structure taken at a line B-B' as shown in FIG. 6A. As shown in the example of FIG. 6A, the stacks of bit lines are separated by trenches (351) having a first width (W1). Insulating structures (651-654) separate the vertical gate structures, the vertical channel structures, and the memory elements in the trenches. The insulating structures have a second width (W2) greater than the first width (W1).

FIGS. 7A, 7B, 8A and 8B illustrate stages in the process flow for forming horizontal conductive lines over and insulated from the top surfaces of the vertical gate structures.

Figure 7A:
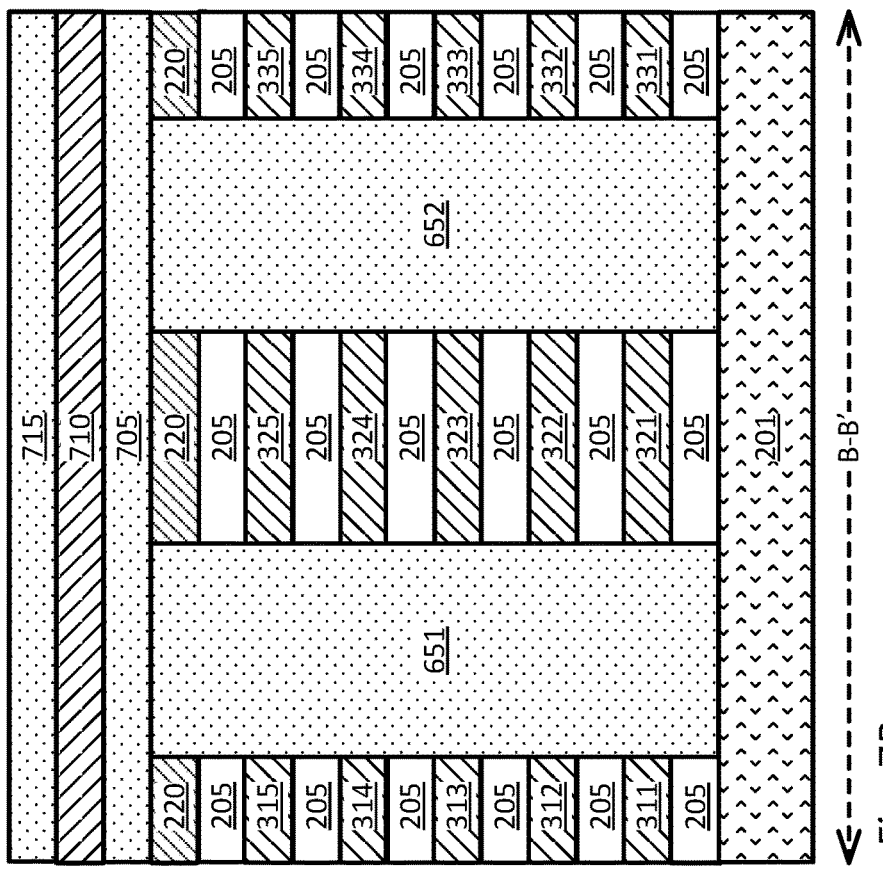
Figure 7B:
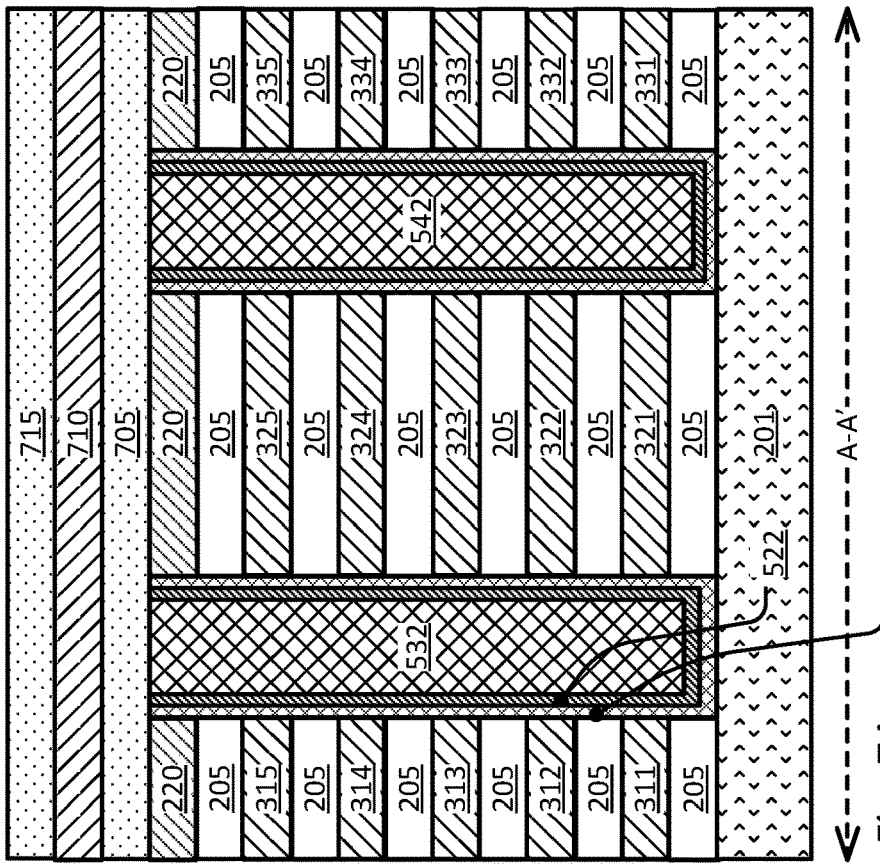

FIGS. 7A and 7B illustrate a stage in the process flow after forming a first insulating layer 705 over the stacks of bit lines (311-315, 321-325, 331-335), including over top surfaces of the vertical gate structures (e.g. 532, 542), forming a conductive layer 710 over the first insulating layer 705, and forming a second insulating layer 715 over the conductive layer 710. The first and second insulating layers 705 and 715 can include oxide materials, e.g. silicon oxide. The conductive layer 710 can include N+ polysilicon or P+ polysilicon.

FIG. 7A is a vertical cross sectional view of the structure illustrating a first insulating layer 705, a conductive layer 710, a second insulating layer 715, and vertical gate structures (532, 542). The vertical channel structures (e.g. 512) can provide channels between adjacent bit lines (e.g. 311, 312) in the stacks. FIG. 7B is a vertical cross sectional view of the structure illustrating a first insulating layer 705, a conductive layer 710, a second insulating layer 715, and insulating structures 651 and 652.

Figure 8A:
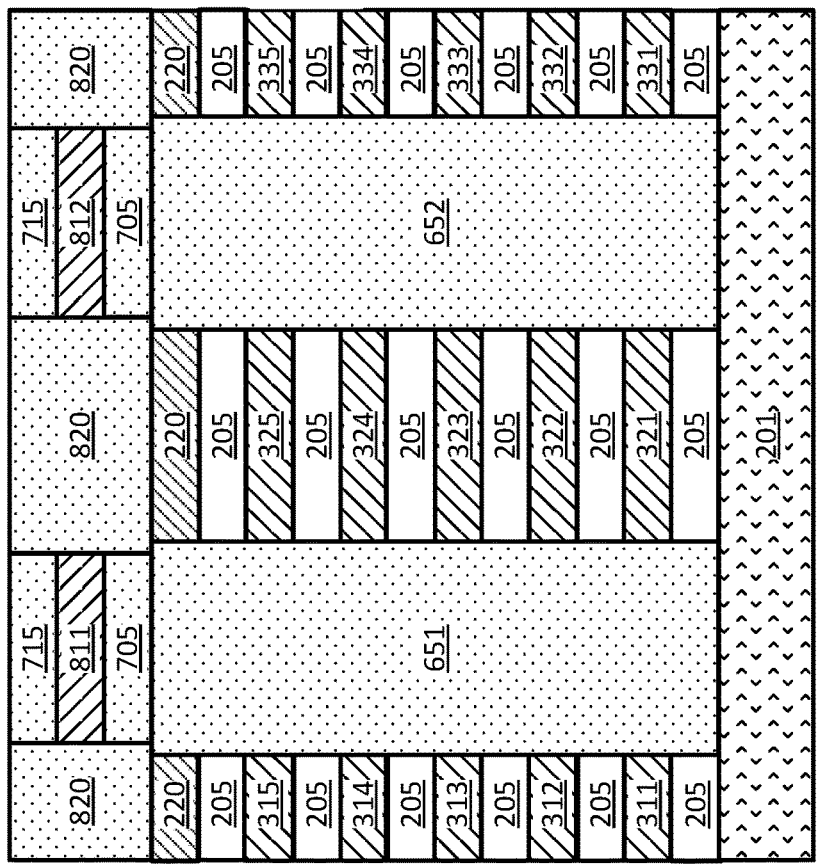
Figure 8B:
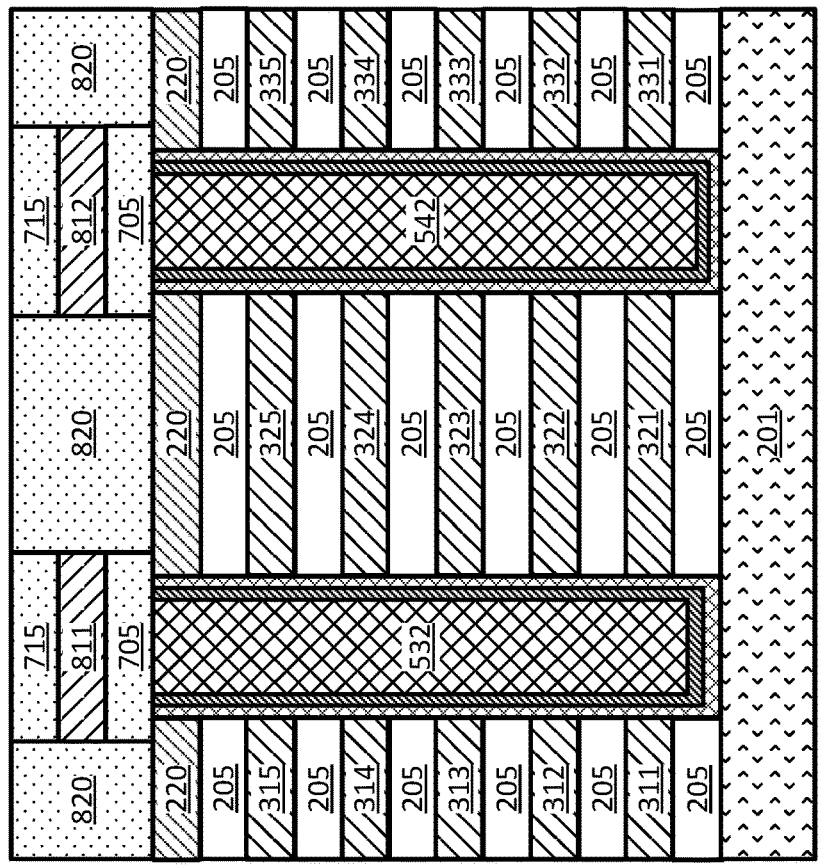

FIGS. 8A and 8B illustrate a stage in the process flow after etching the first insulating layer 705, the conductive layer 710 and the second insulating layer 715 to separate the conductive layer 710 into horizontal conductive lines (811, 812) over and insulated from the top surfaces of the vertical gate structures (532, 542). An insulating fill 820, such as silicon oxide, is deposited to separate adjacent horizontal conductive lines. A chemical mechanical planarization CMP process can then be applied over the structure, stopping at the second insulating layer 715.

FIG. 8A is a vertical cross sectional view of the structure illustrating horizontal conductive lines (811, 812) and vertical gate structures (532, 542). FIG. 8B is a vertical cross sectional view of the structure illustrating horizontal conductive lines (811, 812), and insulating structures 651 and 652.

FIGS. 9A, 9B and 9C illustrate stages in the process flow for forming a plurality of word line transistors (910, 920) disposed over and connected to respective vertical gate structures (532, 542). FIG. 9A is a horizontal cross sectional view of the structure at this stage, at a level of landing pads (933, 934). FIG. 9B is a vertical cross sectional view of the structure taken at a line A-A' as shown in FIG. 9A. A vertical cross sectional view of the structure taken at a line B-B' is as described in reference to FIG. 8B. FIG. 9C illustrates an enlarged view of a word line transistor (e.g. 910) as shown in FIG. 9B.

As shown in FIGS. 9B and 9C, the stages can include etching holes (901, FIG. 9C) through the horizontal conductive lines 811 over the top surfaces of the vertical gate structures (e.g. 532), stopping on the top surfaces. The vertical gate structures have a third width W3 (FIG. 9B), and the holes have a hole width 902 (FIG. 9C) less than the third width W3. Insulating spacers 911 (FIG. 9C) can be formed on sidewalls of the holes. Word line transistor channel structures 912 can be formed in the holes that include vertical channel films 912v over the insulating spacers on the sidewalls of the holes, and horizontal channel films 912h over and connected to the top surfaces of the vertical gate structures. Word line transistor channel structures 912 are connected at lower ends to the vertical gate structures 532. The word line transistor channel structures 912 have a fourth width W4 less than the third width W3 of the vertical gate structures, so the word line transistor channel structures are physically separated from the vertical channel structures 512 disposed between outside surfaces of the vertical gate structures and sidewalls of insulating strips in the stacks of bit lines. The holes through the horizontal conductive lines can be filled with insulating material 913.

Landing pads 931-936 (FIG. 9A) can be formed connected to respective word line transistor channel structures 912 (FIG. 9C) at upper ends of the word line transistor channel structures. Forming a landing pad can include forming a recess into the insulating material 913, depositing a conductive material such as N+ polysilicon into the recess, and applying a chemical mechanical planarization CMP process over the structure.

Figure 10C:
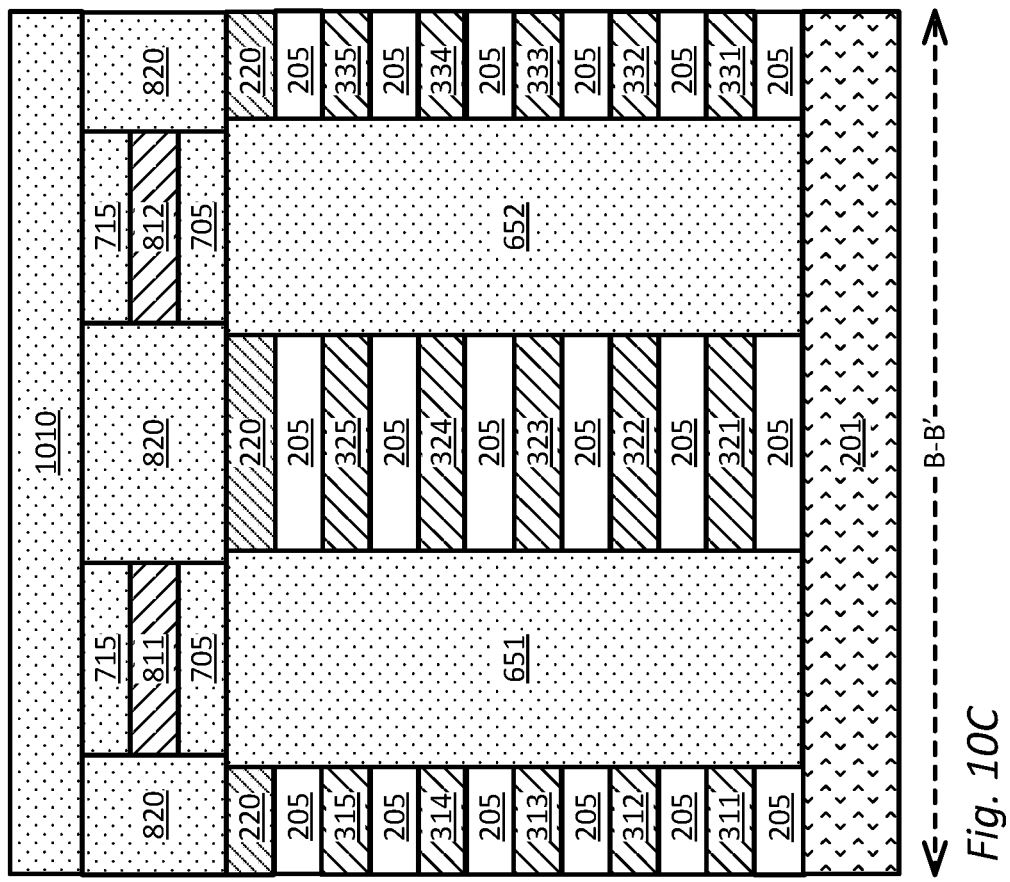

FIGS. 10A, 10B and 10C illustrate a stage in the process flow after forming a plurality of word lines over and connected to the word line transistors via contacts to the landing pads. FIG. 10A illustrates relative layouts of elements in the structure at different levels, including the word lines (1031, 1032, 1033) disposed over the landing pads (931-936) and the word line transistors including insulating spacers 911 and word line transistor channel structures 912, and the horizontal conductive lines (811, 812) disposed beneath the word lines and through which the word line transistors are formed. The word lines extend in a first direction (X-direction). The horizontal conductive lines extend in a second direction (Y-direction) orthogonal to the first direction. The word line transistors are disposed at intersections of the word lines and the horizontal conductive lines.

FIG. 10B is a vertical cross sectional view of the structure taken at a line A-A' as shown in FIG. 10A. FIG. 10C is a vertical cross sectional view of the structure taken at a line B-B' as shown in FIG. 10A.

At this stage, an insulating layer 1010, e.g. $SiO_2$, can be formed over the plurality of word line transistors (910, 920) and the landing pads (933, 934) connected to the word line transistors. Holes can be etched through the insulating layer 1010 over the plurality of word line transistors, stopping on the landing pads (933, 934). Contacts (1021, 1022) can be formed in the holes, where the contacts are disposed over and connected to respective landing pads. A conductive layer can be formed over the contacts, and the conductive layer can be etched to form a plurality of word lines (1031, 1032, 1033) connected to the contacts. For instance, a word line 1032 in the plurality of word lines can be connected to the contacts 1021 and 1022 which are connected to the word line transistors 910 and 920, respectively. The word lines are disposed parallel to the bit lines in the stacks of bit lines (311-315, 321-325, 331-335).

Figure 11:
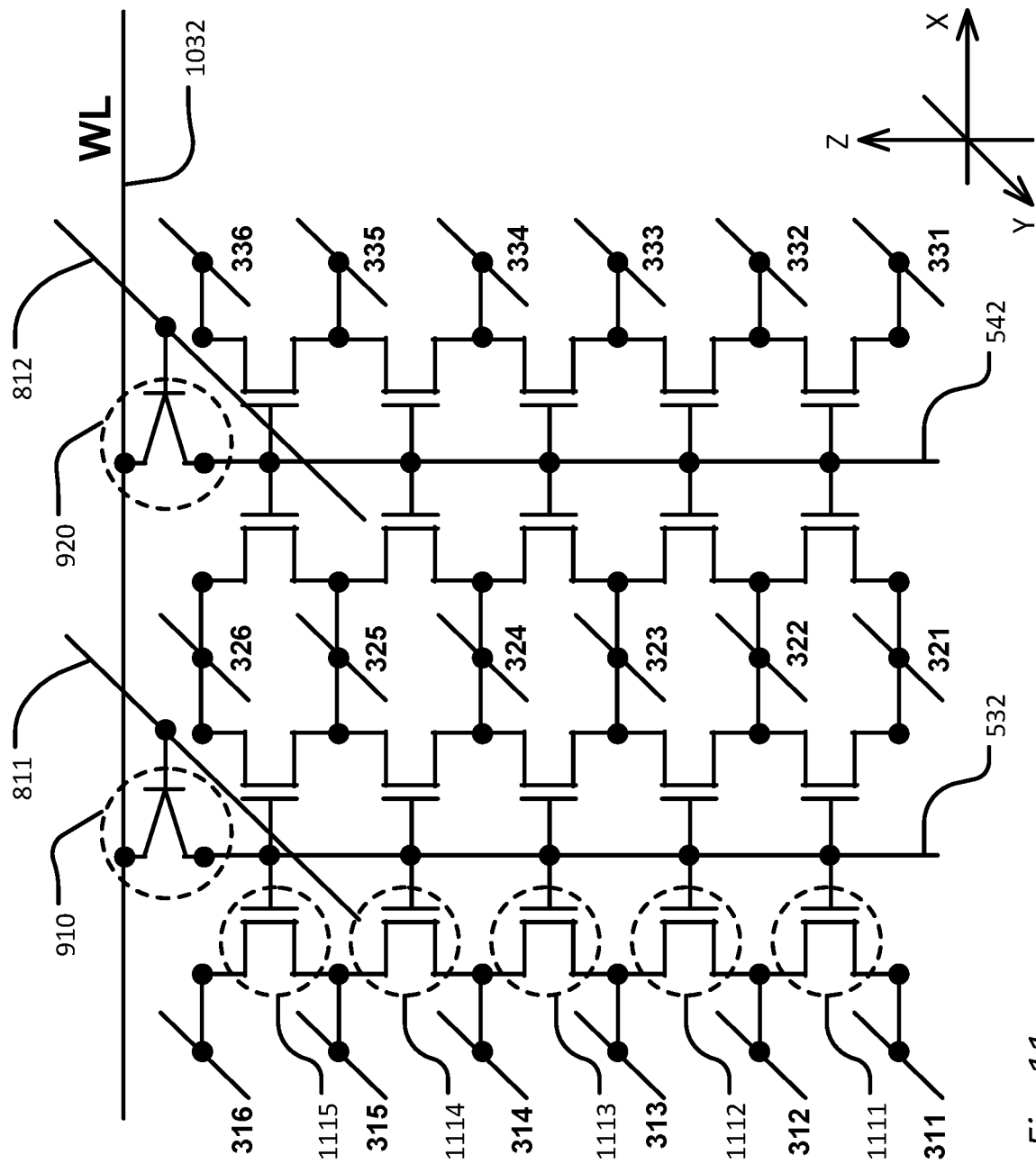
FIG. 11 illustrates a single channel operation in reference to a schematic diagram.

FIG. 11 illustrates a single channel operation in reference to a schematic diagram. A circuit shown in the schematic diagram includes a plurality of stacks of memory cells (e.g. 1111-1115). Memory cells in the stacks are connected to respective bit lines (311-316, 321-326, 331-336). For instance, a particular memory cell 1111 is connected to a first bit line 311 and a second bit line 312. Stacks of memory cells are connected to respective vertical gate structures (532, 542). Vertical gate structures (532, 542) are connected to respective word line transistors (910, 920), which can be connected to a word line 1032.

Circuitry connected to the bit lines in the stacks of bit lines (311-316, 321-326, 331-336) can apply bit line voltages and source line voltages to the bit lines. For a single channel operation, the circuitry can be configured to select a particular memory cell (e.g. 1111) disposed at a cross-point between a particular vertical gate structure (e.g. 532, FIG. 10B) and the sidewall of a particular insulating strip (e.g. 205 between 311 and 312, FIG. 10B) in a particular stack (e.g. 311-315, FIG. 10B).

A bit line voltage can be a drain side voltage (e.g. VCC) and a source line voltage can be a source side voltage (e.g. 0V). In a virtual ground configuration, bit lines other than the bit lines connected to the selected particular memory cell can be floated when the bit line voltage and the source line voltage are applied to select the particular memory cell.

The role of the bit lines connected to the selected particular memory cell can be reversed by decoding circuitry (e.g. 1450, FIG. 14) in a virtual ground configuration. For instance, in one read operation, a first bit line 311 and a second bit line 312 can act as a bit line and a source line, respectively. In this read operation, a bit line voltage can be applied to the first bit line 311 and a source line voltage can be applied to the second bit line 312, in order to select a particular memory cell 1111 connected to the first and second bit lines. In another read operation, a first bit line 311 and a second bit line 312 can act as a source line and a bit line, respectively. In this read operation, a bit line voltage can be applied to the second bit line 312 and a source line voltage can be applied to the first bit line 311, in order to select the particular memory cell 1111 connected to the first and second bit lines.

Figure 12:
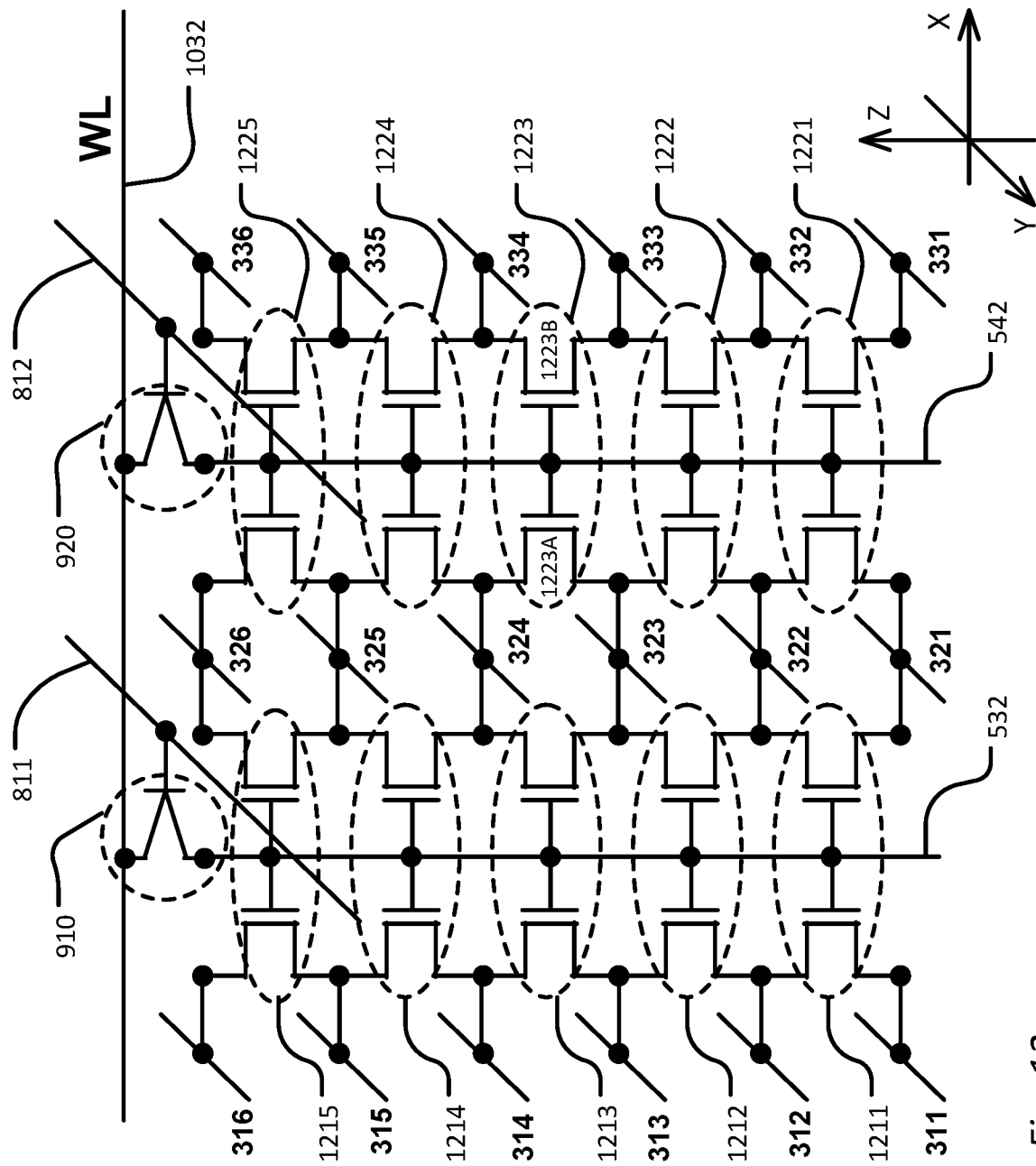
FIG. 12 illustrates a double channel operation in reference to a schematic diagram.

FIG. 12 illustrates a double channel operation in reference to a schematic diagram. A circuit shown in the schematic diagram includes a plurality of stacks of double channel memory cells (e.g. 1211-1215, 1221-1225). A double channel memory cell includes a first single channel cell and a second single channel cell, where the first single channel cell is connected to a first bit line and a second bit line in a first stack of bit lines, and the second single channel cell is connected to a third bit line and a fourth bit line in a second stack of bit lines. For instance, a particular double channel memory cell 1223 can include a first single channel cell 1223A connected to a first bit line 323 and a second bit line 324, and a second single channel cell 1223B connected to a third bit line 333 and a fourth bit line 334. Stacks of double channel memory cells are connected to respective vertical gate structures (532, 542). Vertical gate structures (532, 542) are connected to respective word line transistors (910, 920), which can be connected to a word line 1032.

Circuitry connected to the bit lines in the stacks of bit lines (311-316, 321-326, 331-336) can apply bit line voltages and source line voltages to the bit lines. For a double channel operation, the circuitry can be configured to select a particular memory cell (1223) disposed at a first cross-point between a particular vertical gate structure (542) and the sidewall of a first insulating strip (e.g. 205 between 323 and 324, FIG. 10B) in a first stack of bit lines (321-326) and at a second cross-point between the particular vertical gate structure (542) and the sidewall of a second insulating strip (e.g. 205 between 333 and 334, FIG. 10B) in a second stack of bit lines (331-335, FIG. 10B) adjacent the first stack of bit lines.

A bit line voltage can be a drain side voltage (e.g. VCC) and a source line voltage (e.g. VCC) can be a source side voltage (e.g. 0V). In a virtual ground configuration, bit lines other than the bit lines connected to the selected particular memory cell can be floated when the bit line voltages and the source line voltages are applied to the first, second, third and third bit lines to select the particular memory cell. The role of the bit lines connected to the selected particular memory cell can be reversed by decoding circuitry (e.g. 1450, FIG. 14) in a virtual ground configuration.

Figure 13:
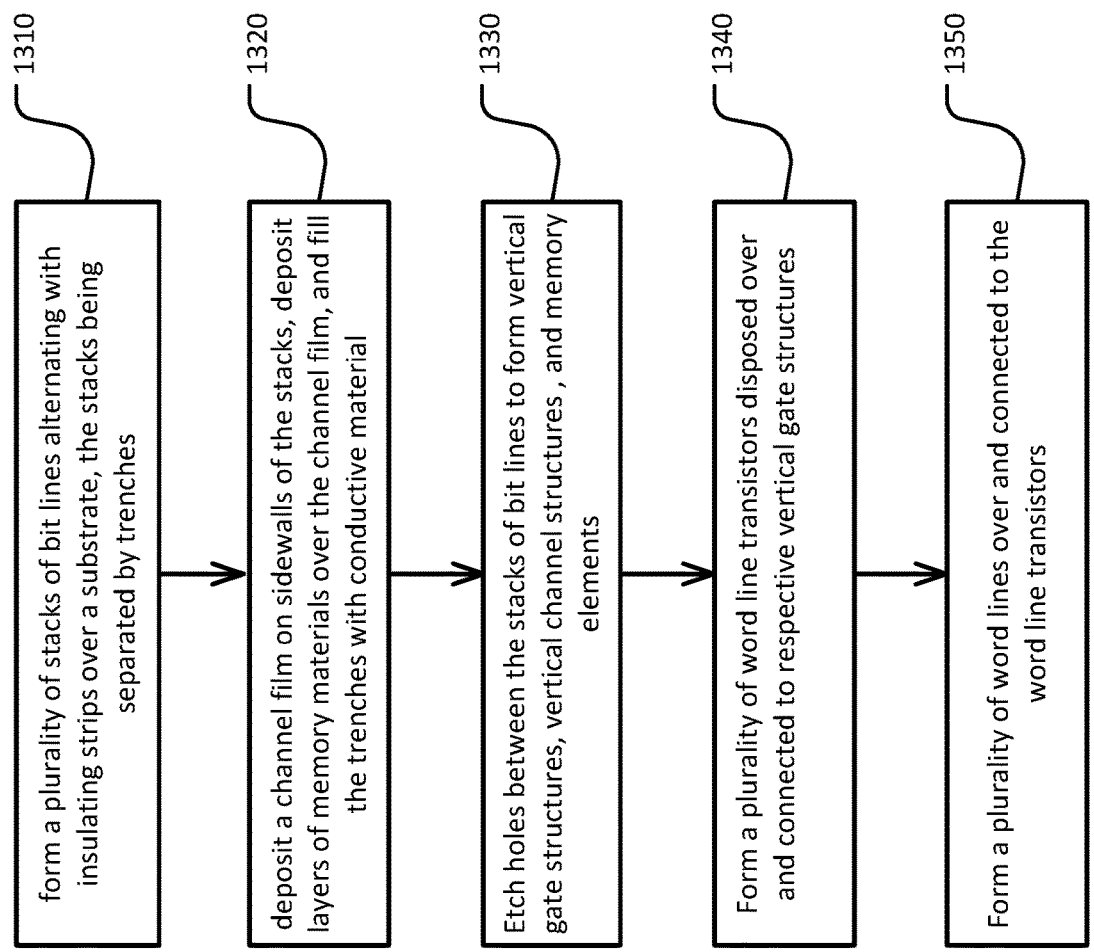
FIG. 13 is a simplified flow chart illustrating a manufacturing process for an integrated circuit memory device.

FIG. 13 is a simplified flow chart illustrating a manufacturing process for an integrated circuit memory device. At Step 1310, a plurality of stacks of bit lines alternating with insulating strips can be formed over an insulating layer on a substrate, where the stacks are separated by trenches. This step is further described in reference to FIGS. 3A and 3B.

At Step 1320, a channel film can be deposited on sidewalls of the stacks, layers of memory materials can be deposited over the channel film on sidewalls of the stacks, and the trenches can be filled with conductive material over the layers of memory materials. The vertical channel structures can provide channels between adjacent bit lines in the stacks. This step is further described in reference to FIGS. 4A and 4B.

At Step 1330, holes can be etched between the stacks of bit lines to separate the conductive material in the trenches, the channel film and the layers of memory materials on the sidewalls of the stacks, into the vertical gate structures, the vertical channel structures and the memory elements, respectively. The holes between the stacks of bit lines can then be filled with insulating material. The vertical channel structures and memory elements can be disposed between outside surfaces of the vertical gate structures and sidewalls of insulating strips in the stacks of bit lines. This step is further described in reference to FIGS. 5A, 5B, 6A and 6B.

At Step 1340, a plurality of word line transistors can be formed over and connected to respective vertical gate structures. This step is further described in reference to FIGS. 7A, 7B, 8A, 8B, 9A, 9B and 9C.

At Step 1350, a plurality of word lines can be formed over and connected to the word line transistors. This step is further described in reference to FIGS. 10A, 10B and 10C.

Circuitry connected to the bit lines in the stacks of bit lines can be formed to apply bit line and source line voltages to the bit lines, as further described in reference to FIGS. 11 and 12.

Figure 14:
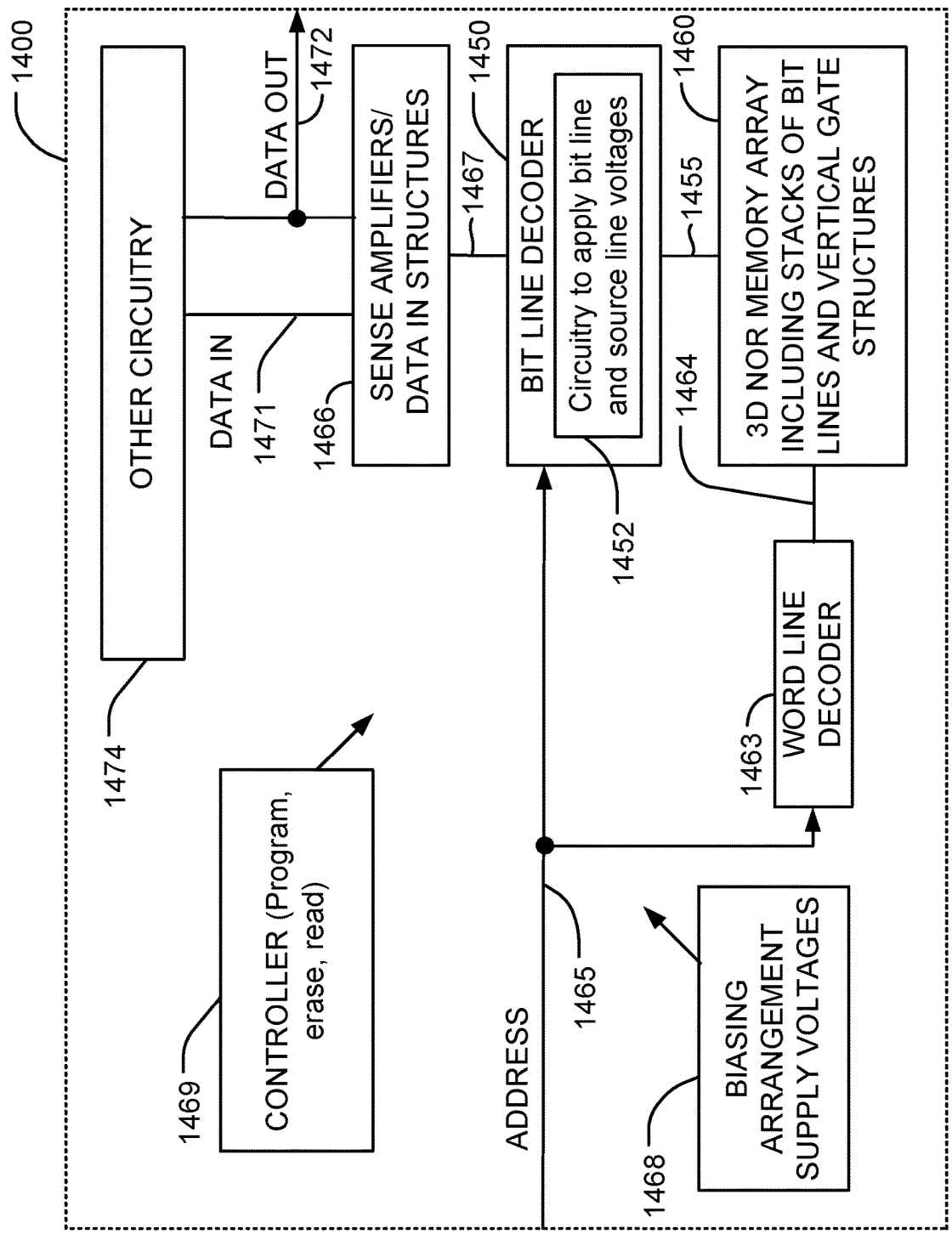
FIG. 14 a simplified block diagram of an integrated circuit memory device in accordance with the present technology.

FIG. 14 a simplified block diagram of an integrated circuit memory device in accordance with the present technology. In the example shown in FIG. 14, the integrated circuit memory device 1400 includes a NOR memory array including a plurality of stacks of bit lines alternating with insulating strips over an insulating layer on a substrate, a plurality of vertical gate structures disposed between the stacks, and vertical channel structures and memory elements disposed between outside surfaces of the vertical gate structures and sidewalls of insulating strips in the stacks of bit lines. The vertical channel structures can provide channels between adjacent bit lines in the stacks. The stacks of bit lines are separated by trenches having a first width. Insulating structures separate the vertical gate structures, the vertical channel structures, and the memory elements in the trenches. The insulating structures have a second width greater than the first width.

The memory device comprises a plurality of word line transistors disposed over and connected to respective vertical gate structures, and a plurality of word lines disposed over and connected to the word line transistors. The word line transistors comprise word line transistor channel structures connected at lower ends to respective vertical gate structures, and connected at upper ends to respective landing pads. The word lines are connected to the word line transistors via contacts to the landing pads. The vertical gate structures have a third width, and the word line transistor channel structures have a fourth width less than the third width.

A bit line decoder 1450 includes circuitry 1452 connected to bit lines 1455 in the stacks of bit lines in the 3D NOR memory array 1460. Circuitry 1452 can apply bit line and source line voltages to the bit lines in the stacks of bit lines in the memory array 1460. Circuitry 1452 can be configured to select a particular memory cell in the memory array, as further described in reference to FIG. 11 for a single channel operation, and in reference to FIG. 12 for a double channel operation.

A word line decoder 1463 is coupled to a plurality of word lines 1464 for reading and programming data from the memory cells in the memory array 1460. Addresses are supplied on bus 1465 to word line decoder 1463 and bit line decoder 1450. Sense amplifiers and data-in structures in block 1466 are coupled to the bit line decoder 1450 in this example via data bus 1467. Data is supplied via the data-in line 1471 from input/output ports on the integrated circuit 1400 or from other data sources internal or external to the integrated circuit 1400, to the data-in structures in block 1466. In the illustrated embodiment, other circuitry 1474 is included on the integrated circuit, such as a general purpose processor or special purpose application circuitry, or a combination of modules providing system-on-a-chip functionality supported by the programmable resistance cell array. Data is supplied via the data-out line 1472 from the sense amplifiers in block 1466 to input/output ports on the integrated circuit 1400, or to other data destinations internal or external to the integrated circuit 1400.

A controller 1469 implemented in this example using bias arrangement state machine controls the application of bias arrangement supply voltage generated or provided through the voltage supply or supplies in block 1468, such as program, erase and read voltages.

The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a plurality of stacks of bit lines alternating with insulating strips over an insulating layer on a substrate, wherein the stacks of bit lines are separated by trenches having a first width;
a plurality of vertical gate structures disposed between the stacks;
vertical channel structures and memory elements disposed between outside surfaces of the vertical gate structures and sidewalls of insulating strips in the stacks of bit lines, the vertical channel structures providing channels between adjacent bit lines in the stacks; and
insulating structures separating the vertical gate structures, the vertical channel structures, and the memory elements in the trenches, wherein the insulating structures have a second width greater than the first width.

2. A memory device, comprising:
a plurality of stacks of bit lines alternating with insulating strips over an insulating layer on a substrate;
a plurality of vertical gate structures disposed between the stacks;
vertical channel structures and memory elements disposed between outside surfaces of the vertical gate structures and sidewalls of insulating strips in the stacks of bit lines, the vertical channel structures providing channels between adjacent bit lines in the stacks;
a plurality of word line transistors disposed over and connected to respective vertical gate structures; and
a plurality of word lines disposed over and connected to the word line transistors.

3. The memory device of claim 2, wherein the word line transistors comprise word line transistor channel structures connected at lower ends to respective vertical gate structures, and connected at upper ends to respective landing pads, the word lines connected to the word line transistors via contacts to the landing pads.

4. The memory device of claim 3, wherein the vertical gate structures have a third width, and the word line transistor channel structures have a fourth width less than the third width.

5. The memory device of claim 1, comprising:
circuitry connected to the bit lines to apply bit line and source line voltages to the bit lines.

6. The memory device of claim 5, wherein the bit line voltage is a drain side voltage and the source line voltage is a source side voltage.

7. The memory device of claim 2, wherein
circuitry configured to select a particular memory cell disposed at a cross-point between a particular vertical gate structure and the sidewall of a particular insulating strip in a particular stack, the particular insulating strip disposed between and in contact with a first bit line and a second bit line in the particular stack, by:
turning on a particular word line transistor in the plurality of word line transistors connected to the particular vertical gate structure;
applying a word line voltage to a particular word line connected to the particular word line transistor;
applying a bit line voltage to the first bit line in the particular stack; and
applying a source line voltage to the second bit line in the particular stack.

8. The memory device of claim 7, including floating the bit lines other than the first and second bit lines in the first stack when applying the bit line voltage and the source line voltage.

9. The memory device of claim 7, wherein the first and second bit lines are disposed at levels below a top level of the stacks.

10. A manufacturing method, comprising:
forming a plurality of stacks of bit lines alternating with insulating strips over a substrate;
forming a plurality of vertical gate structures disposed between the stacks;
forming vertical channel structures and memory elements disposed between outside surfaces of the vertical gate structures and sidewalls of insulating strips in the stacks of bit lines, the vertical channel structures providing channels between adjacent bit lines in the stacks;

forming a plurality of word line transistors disposed over and connected to respective vertical gate structures; and forming a plurality of word lines disposed over and connected to the word line transistors.

11. The method of claim 10, comprising:

etching a stack of conductive layers alternating with insulating layers to form the plurality of stacks of bit lines alternating with insulating strips, the stacks separated by trenches through the conductive layers to the substrate;

depositing a channel film on sidewalls of the stacks;

depositing layers of memory materials over the channel film on sidewalls of the stacks; and filling the trenches with conductive material over the layers of memory materials.

12. The method of claim 11, comprising:

etching holes between the stacks of bit lines to separate the conductive material in the trenches, the channel film and the layers of memory materials on the sidewalls of the stacks, into the vertical gate structures, the vertical channel structures and the memory elements, respectively; and filling the holes between the stacks of bit lines with insulating material to form insulating structures.

13. The method of claim 10, wherein the word line transistors comprise channel films connected at lower ends to respective vertical gate structures, the method comprising:

forming landing pads connected to respective channel films at upper ends, the word lines connected to the word line transistors via contacts to the landing pads.

14. The method of claim 10, said forming a plurality of word line transistors comprising:

forming horizontal conductive lines over and insulated from the top surfaces of the vertical gate structures, including:

forming a first insulating layer over the stacks of bit lines, including over top surfaces of the vertical gate structures;

forming a conductive layer over the first insulating layer;

forming a second insulating layer over the conductive layer; and etching the first insulating layer, the conductive layer and the second insulating layer to separate the conductive layer into the horizontal conductive lines over and insulated from the top surfaces of the vertical gate structures.

15. The method of claim 14, comprising:

etching holes through the horizontal conductive lines over the top surfaces of the vertical gate structures, stopping on the top surfaces, the holes having a hole width less than a third width of the vertical gate structures;

forming insulating spacers on sidewalls of the holes;

forming word line transistor channel structures over the insulating spacers on the sidewalls of the holes, the channel films connected at lower ends to the vertical gate structures, the word line transistor channel structures having a fourth width less than the third width of the vertical gate structures; and filling the holes through the horizontal conductive lines with insulating material.

16. The method of claim 13, said forming the plurality of word lines comprising:

forming an insulating layer over the plurality of word line transistors;

etching holes through the insulating layer over the plurality of word line transistors, stopping on the landing pads;

forming the contacts in the holes, the contacts over and connected to respective landing pads;

forming a conductive layer over the contacts; and etching the conductive layer to form the plurality of word lines connected to the contacts.

17. The method of claim 10, comprising:

forming circuitry connected to the bit lines to apply bit line and source line voltages to the bit lines.

\* \* \* \* \*